United States Patent [19]

Liu

[11] Patent Number: 5,637,532
[45] Date of Patent: Jun. 10, 1997

[54] INTERCONNECT DECOUPLING SCHEME

[75] Inventor: Yong Liu, Santa Clara, Calif.

[73] Assignee: Advanced Micro Devices, Inc., Sunnyvale, Calif.

[21] Appl. No.: 481,164

[22] Filed: Jun. 7, 1995

[51] Int. Cl.$^6$ .................. H01L 21/26; H01L 21/268; H01L 21/306; H01L 21/42

[52] U.S. Cl. .................. 438/3; 257/629; 438/800

[58] Field of Search .................. 257/421, 422, 257/423, 424, 425, 426, 427; 250/492.1, 492.2; 437/173, 250

[56] References Cited

U.S. PATENT DOCUMENTS 3,811,075   5/1974   Shiga .......................... 257/423

*Primary Examiner*—John Niebling
*Assistant Examiner*—Brian K. Dutton

[57] ABSTRACT

Capacitive coupling between neighboring conductive lines of the semiconductor device is reduced by applying an alternating magnetic field in a direction perpendicular to the plane of the conductive lines.

17 Claims, 2 Drawing Sheets

INTERCONNECT DECOUPLING SCHEME

TECHNICAL FIELD

The present invention relates to an apparatus comprising a semiconductor device having a plurality of conductive lines, and to a method of utilizing the semiconductor device wherein capacitive coupling between neighboring conductive lines is reduced. The invention has particular application with semiconductor devices having submicron circuitry.

BACKGROUND ART

A typical semiconductor device comprises a plurality of generally parallel conductive lines, typically made of a conductive material, such as polysilicon or a metal, or a stacked layer of conductive materials. These conductive lines form parts of numerous integrated circuits of semiconductor devices on a semiconductor chip. During operation of a semiconductor device, a conductive line 10 carries current $I_{10}$, which can move in either direction, as depicted in FIG. 1. This corresponds to negative (positive) charges moving in a direction opposite (same) to the direction of $I_{10}$. Consider two neighboring interconnect lines in FIG. 2. When line 20 is charged up, which can be represented by accumulation of positive charges, negative charges will be induced in line 21. These opposite charges attract each other, resulting in accumulation of charges on the metal surfaces facing each other, as is shown in FIG. 2. The coupling capacitance can be approximated by the formula $$C = K^*(t^*L)/S$$

wherein $K^*$ represents the dielectric constant of the material between and surrounding the conductive lines, L is the length of the conductive line, W is the width of the conductive lines, S is the distance between the conductive lines, and $t^*$ is the thickness of the conductive lines.

The escalating requirements for high density and performance associated with ultra large scale integration require responsive changes, which is considered one of the most demanding aspects of ultra large scale integration technology. High density demands for ultra large scale integration of semiconductor wiring, which require increasingly denser arrays with minimal spacing between conductive lines. The objective is hindered by the fact that denser arrays and smaller line widths result in larger sidewalls of the metal lines and much larger coupling capacitances. In fact, for 0.5 micron technology and below, the coupling capacitance dominates the total capacitance loading of metal lines. This increase of capacitance loading, and, therefore, interconnect delay, combined with increasingly faster transistors results in a circuit where the interconnect delay dominates the total circuit delay. Thus, there exists a great need for a way to reduce interconnect capacitances. Thus, the combined requirements of high speed and high density conductive wiring patterns poses a challenge which, to date, has not been satisfactorily achieved.

The adverse impact of capacitive coupling on the operation of a semiconductor device generated by neighboring conductive lines spaced apart by a distance greater than about 1.0 micron is tolerable. However, with interwiring spacings of less than about 1.0 micron, such as less than about 0.7 microns, particularly less than about 0.5 microns, in response to the escalating requirements for density and performance associated with ultra large scale integration, the adverse consequences of the capacitive coupling effect, particularly the reduction in circuit speed, create serious problems, which require reduction of the capacitive coupling effect.

Typically, a semiconductor chip comprises a plurality of semiconductor devices each of which has one or more layers containing a plurality of conductive lines situated in a common plane which function in one or more circuits. Thus, as the interwiring spacing is reduced below 1.0 micron, particularly below 0.5 microns, the problems generated by the capacitive coupling effect become particularly acute. Moreover, semiconductor chips are conventionally placed on a printed circuit board and interconnected by a plurality of conductive wires which also generate a capacitive coupling or, more specifically, electromagnetic wave coupling effect. In addition, a plurality of semiconductor chips are conventionally interconnected in a multicomponent module by a plurality of conductive wires which generate a capacitive coupling effect.

In the manufacturing of a semiconductor device, after a conductive layer is etched to form a plurality of conductive lines, a dielectric layer is deposited to fill the interwiring spacings, and then planarized, as by etching or chemical-mechanical polishing. Silicon dioxide is conventionally employed as the dielectric material in forming dielectric layers. Currently, research in underway to resolve the capacitive coupling effect by developing materials having a lower dielectric constant than silicon dioxide to form dielectric layers in which the conductive lines are situated. However, this approach has not met with any degree of success, primarily because of the problems engendered by resorting to a material other than silicon dioxide to form a dielectric layer.

During the manufacturer of a semiconductor device, numerous process operations are performed in connection with a dielectric layer, such as deposition, etching and planarization. As a result, numerous process parameters have been developed which are linked to the particular characteristics of silicon dioxide. The introduction of a different dielectric material, other than silicon dioxide, disadvantageously carries with it new characteristics which require extensive experimentation to redefine numerous processing operations. Moreover, new materials generate different stress patterns and contamination problems.

Thus, there exists a need to solve the capacitive coupling effect generated between neighboring closely spaced conductive lines of the semiconductor device, particularly between conductive lines having interwiring spacings of less than about 1.0 micron, particularly less than about 0.5 microns, in a cost-effective expeditious manner without resorting to new materials.

DISCLOSURE OF THE INVENTION

An object of the present invention is an apparatus comprising a semiconductor device which, during use, exhibits a substantially reduced capacitive coupling effect between neighboring closely spaced conductive lines.

Another object of the present invention is a method for reducing the capacitive coupling effect in a semiconductor device.

Additional objects, advantages and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

According to the present invention, the foregoing and other objects are achieved in part by an apparatus comprising a semiconductor chip having thereon at least one semiconductor device comprising layers of a plurality of conductive lines situated in a common plane, and means for applying an alternating magnetic field to the semiconductor device in a direction perpendicular to the plane of the conductive lines, wherein the alternating magnetic field reduces capacitive coupling between neighboring conductive lines.

Another aspect of the invention is a method of using a semiconductor chip having thereon at least one semiconductor device comprising layers of a plurality of conductive lines situated in a common plane, wherein current is passed through the conductive lines, which method comprises applying an alternating magnetic field to the semiconductor device in a direction perpendicular to the plane of the conductive lines, thereby reducing capacitive coupling between neighboring conductive lines.

A further aspect of the present invention is a method of reducing capacitive coupling between neighboring conducting lines in a semiconductor device, wherein the conductive lines are situated in a common plane, which method comprises applying an alternating magnetic field to the semiconductor device in a direction perpendicular to the plane of the conductive lines.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention is directed to reducing the capacitive coupling effect generated between neighboring current carrying conductive lines of a semiconductor device, particularly between conductive lines of a dense array separated by a distance of less than about 1.0 micron, such as less than about 0.7 microns, most particularly less than about 0.5 microns. The present invention is also directed to reducing capacitive coupling between neighboring conductive lines interconnecting semiconductor chips on a printed circuit board, and to reduce capacitive coupling generated between neighboring conductive lines interconnecting semiconductor chips in a multicomponent module.

Figure 1:
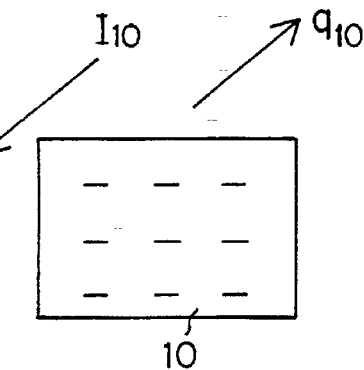
FIG. 1 schematically depicts a cross-section of a conventional current carrying conductive line.
Figure 2:
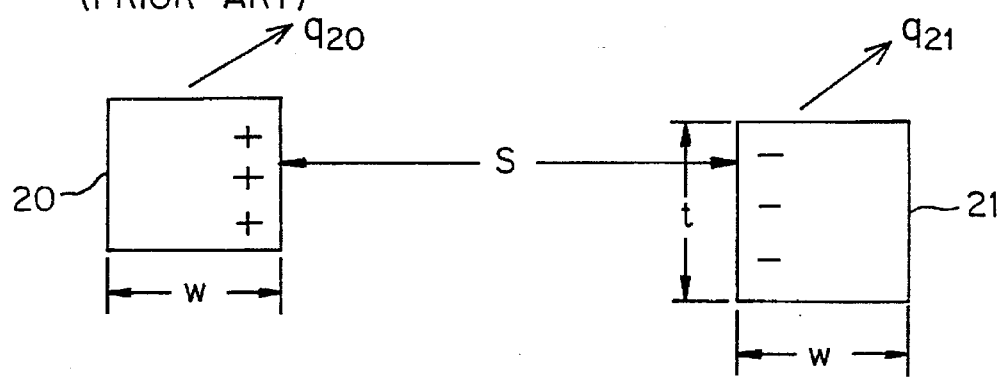
FIG. 2 schematically depicts a cross-sectional view of two conventional neighboring current carrying conductive lines.
Figure 3:
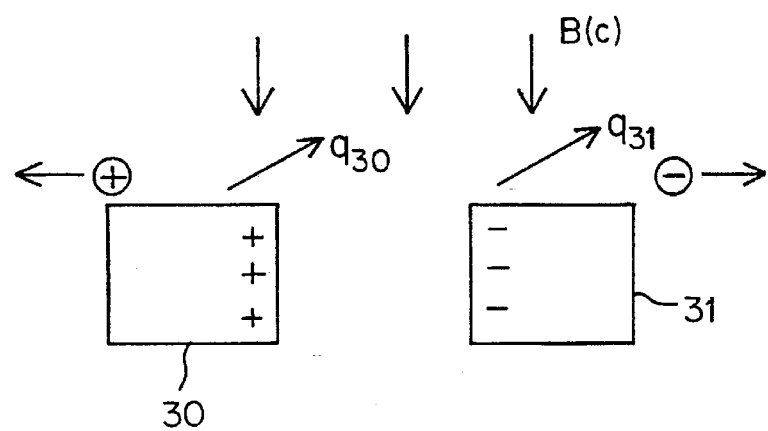
FIG. 3 shows the effect of applying a constant magnetic field to two neighboring current carrying conductive lines.

Consider the two metal lines in FIG. 2, when one line is charged up, it induces opposite charges on the next line. When the charges in one line move along the metal line, the induced charges, attracted by the original charges, move in the same direction along the neighboring line. If a constant magnetic field is applied in a direction perpendicular to the plane in which the conductive lines are situated, as is shown in FIG. 3, the Lorentz force impels positive charges to the left and negative charges to the right. The net effect is that the opposite charges in the two neighboring metal lines are separated farther away. This is equivalent to say the parameter S in formula (1) is bigger, or the coupling capacitance is smaller. The amount of reduction is difficult to calculate since it is very difficult to simulate what's happening dynamically. However, it is known that the average amount of displacement of charges depends on the speed the charges are moving and the strength of the magnetic field. The optimum magnetic field can, therefore, be determined in a particular situation. Employing a ring oscillator with heavy interconnect loading, an altering constant magnetic field is applied as shown in FIG. 3. The period of the ring oscillator is then measured to determine the amount of delay reduction due to the magnetic field and the optimum operating point is one that results in the minimum period.

I initially considered the use of a magnetic field to reduce the capacitive coupling effect. For example, the capacitive coupling effect between current carrying closely spaced neighboring conductive lines can be reduced by applying a constant magnetic field in a direction perpendicular to the plane in which the conductive lines are situated. However, as shown in FIG. 3, the application of a constant magnetic field B(c) in a direction perpendicular to the plane of neighboring conductive lines 30 and 31, with moving charges $q_{30}$ and $q_{31}$, respectively, is not a practical resolution to the problems generated by the capacitive coupling effect.

Upon application of a constant magnetic field, the Lorentz force impels positive and negative charges of neighboring charge carrying conductive lines to move in opposite directions. A typical semiconductor device contains numerous conductive lines carrying charges in opposite directions in various portions of the device. Thus, depending on the charge moving direction, the constant magnetic field must be applied in a perpendicular direction from above or below the semiconductor device. It is virtually impossible to adjust the application of a constant magnetic field on a micro scale in order to effectively compensate for the capacitive coupling effect in appropriate areas. Thus, the use of a constant magnetic field to neighboring charge carrying conductive lines to reduce the capacitive coupling is not a viable practical solution.

Figure 4A:
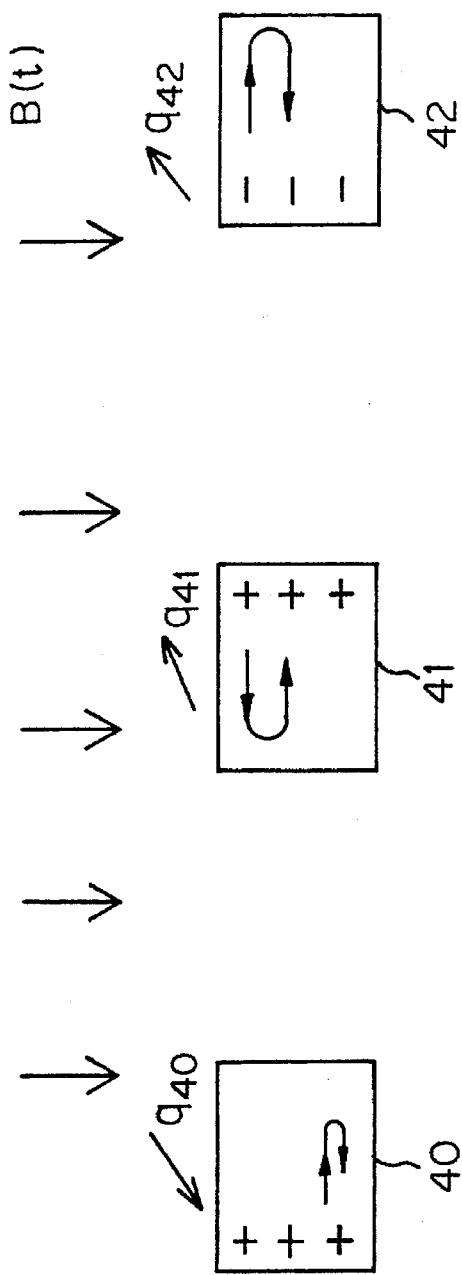
FIG. 4 shows the effect of applying an alternating magnetic field perpendicular to two current carrying conductive lines in accordance with the present invention.
Figure 4B:
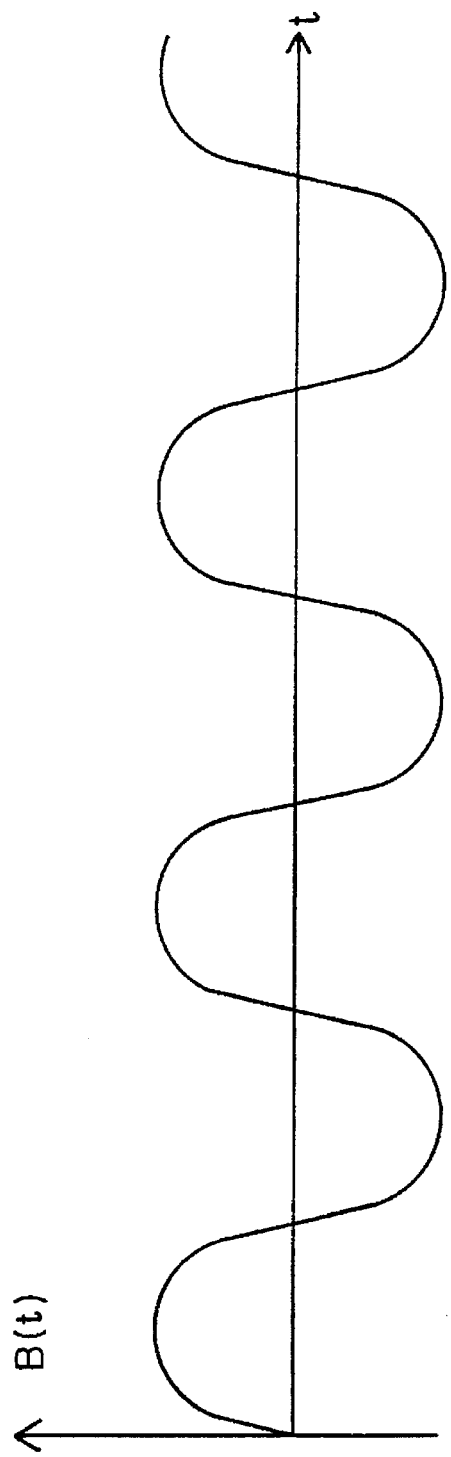

In accordance with the present invention, the problem of capacitive coupling generated between closely spaced neighboring charge carrying conductive lines is resolved by applying an alternating magnetic field, with a direction of magnetization that changes with time, in a direction perpendicular to the neighboring conductive lines. Adverting to FIG. 4, there is schematically depicted the application of an alternating magnetic field B(t) in a direction perpendicular to the plane of closely spaced neighboring charge carrying conductive lines 40, 41 and 42, in accordance with the present invention.

During the effective part of the alternating magnetic field cycle, the Lorentz force moves the induced charge away from the original charge. During the nonproductive portion of the alternating magnetic field cycle, the Lorentz force moves the induced charge toward the original charge; however, if no magnetic field is applied, due to the attraction of opposite charges, the original and induced charge always resides on surfaces of each conductive line facing each other. When the alternating magnetic field is applied in the ineffective direction, the opposite charges are moved toward each other; however, they cannot be moved closer to each other than if no magnetic field is applied since the charges cannot be moved out of the metal line surfaces facing each other. During the effective part of the cycle, the magnetic field moves the opposite charges further apart than if no magnetic field is applied and, therefore, the overall capacitive coupling effect is reduced regardless of the charge moving direction.

When both metal lines carry currents, we can decompose the problem into the superposition of two problems where in each case only one metal line carries current. This is because the metal line system is a linear system and the Maxwell equation that governs the mechanism of the interaction is also linear. Therefore, the above analysis still applies without regard to which direction the current is flowing in which metal line. By the same token, the above analysis can also be extended to cases where more than two metal lines exist.

Accordingly, the present invention involves the application of an alternating magnetic field in a direction perpendicular to the plane of closely spaced neighboring charge carrying conductive lines to effectively reduce capacitive coupling effect. Quite advantageously, an alternating magnetic field is applied to an entire semiconductor chip to effectively reduce capacitive coupling without the necessity of applying a localized magnetic field on a micro scale and without changing the design or layout of the chip.

The present invention also involves the application of an alternating magnetic field in a direction perpendicular to the plane of charge carrying conductive lines which interconnect semiconductor chips on a printed circuit board, and which interconnect connect semiconductor components in a multicomponent module.

The present invention is also directed to an apparatus comprising a semiconductor device having a plurality of closely spaced neighboring charge carrying conductive lines and means for applying an alternating magnet field in a direction perpendicular to the plane of the conductive wires. In addition, the present invention also comprises an apparatus containing a printed circuit board having closely spaced neighboring charge carrying conductive lines interconnecting semiconductor chips, and means for applying an alternating magnetic field in a direction perpendicular to the plane of the connecting current carrying lines, and to an apparatus containing a plurality of semiconductor chips interconnected by closely spaced neighboring charge carrying conductive lines, and means for applying an alternating magnetic field in a direction perpendicular to the plane of such connecting current carrying lines.

The means for applying an alternating magnetic field can be any of the devices conventionally employed to apply an alternating magnetic field and commercially available, such as a typical coil of insulated conducting wires powered by an alternating voltage or current source.

In carrying out the various embodiments of the present invention, one having ordinary skill in the art can easily apply the disclosed method and obtain effective coupling capacitance reduction. Using the experimental approach as disclosed herein, one having ordinary skill in the art can further determine the appropriate and optimum parameters of the alternating magnetic field which depend upon the particular situation, e.g., the particular conductive materials, dimensions of the conductive lines, the speed of the circuit, etc. The parameters of the magnetic field that can be optimized includes its waveform, frequency and amplitude. The choice of the waveform is most likely to be determined by the availability and economy of the electrical source that feeds the coil. The frequency of the magnetic field should be chosen such that the delay time of a signal traveling along the metal line of concern is at least several times larger than that of the period of the magnetic field, which is just the reverse of its frequency. A typical multiplication might be 5 to 100 times. The amplitude of the magnetic field should be chosen such that the charges spend as much time as possible in the middle of a metal line, instead of on left or right surface. This is best determined by optimizing the frequency and amplitude in a particular situation.

Of course, depending on the application circuit, the alternating magnetic field does not have to be periodical, and the waveform does not have to be symmetrical with respect to the zero magnetic field axis. When there is no negative polarization cycle of the magnetic field, only signal flow in certain directions can benefit from the coupling capacitance reduction. This can still be useful for some circuits. A constant magnetic field is a special case of such situation which is much cheaper to implement.

The present invention is not limited to any particular type of means for applying an alternating magnetic field or to any particular type of semiconductor device and, hence, encompasses any conventional semiconductor device, such as CPU, PLD, any ASIC, EPROMS, and EEPROMS, DRAMs, and the like. The present invention effectively reduces capacitive coupling between neighboring conductive lines made of any conductive material, preferably metal. The present invention is advantageously applied to reduce capacitive coupling between neighboring conductive lines spaced apart by a distance less than about 1.0 micron, such as less than about 0.7 microns, preferably less than about 0.5 microns.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

I claim:

1. A method of using a semiconductor chip having thereon at least one semiconductor device comprising layers of a plurality of conductive lines situated in a common plane, wherein current is passed through the conductive lines, which method comprises applying an alternating magnetic field to the semiconductor device in a direction perpendicular to the plane of the conductive lines, thereby reducing capacitive coupling between neighboring conductive lines.

2. The method according to claim 1, wherein the alternating magnetic field is applied to the entire semiconductor chip.

3. The method according to claim 1, wherein the distance between the conductive lines is less than about 1.0 micron.

4. The method according to claim 3, wherein the distance between the conductive lines is less than about 0.7 microns.

5. The method according to claim 4, wherein the distance between the conductive lines is less than about 0.5 microns.

6. The method according to claim 1, wherein the conductive lines comprise a metal.

7. A method of reducing capacitive coupling between neighboring conducting lines in a semiconductor device, wherein the conductive lines are situated in a common plane, which method comprises applying an alternating magnetic field to the semiconductor device in a direction perpendicular to the plane of the conductive lines.

8. The method according to claim 7, wherein the semiconductor device is on a semiconductor chip and the alternating magnetic field is applied to the semiconductor chip.

9. The method according to claim 7, comprising applying the alternating magnetic field to the semiconductor device during the entire period in which the semiconductor chip is in use.

10. The method according to claim 7, wherein the distance between the conductive lines is less than about 1.0 micron.

11. The method according to claim 10, wherein the distance between the conductive lines is less than about 0.7 microns.

12. The method according to claim 11, wherein the distance between the conductive lines is less than about 0.5 microns.

13. The method according to claim 7, wherein the conductive lines comprise a metal.

14. The method according to claim 7, wherein the semiconductor device is in a semiconductor chip which is on a printed circuit board.

15. The method according to claim 14, wherein the printed circuit board comprises plurality of the semiconductor chips interconnected by a plurality conductive lines in a plane, and further comprising applying an alternating magnetic field in a direction perpendicular to the plane of the conductive lines on the printed circuit board, thereby reducing capacitive coupling between neighboring interconnecting conductive lines on the printed circuit board.

16. The method according to claim 7, wherein the semiconductor device is on a semiconductor chip which is part of a multicomponent module comprising a plurality of semiconductor chips interconnected by a plurality of conductive lines in a plane.

17. The method according to claim 16, further comprising applying an alternating magnetic field in a direction perpendicular to the plane of the conductive lines, thereby reducing capacity coupling between neighboring conductive lines.

* * * * *